(12) United States Patent
Zhu et al.

(10) Patent No.: US 11,869,779 B2
(45) Date of Patent: Jan. 9, 2024

(54) WAFER CLEANING EQUIPMENT AND CLEANING METHOD

(71) Applicant: CHANGXIN MEMORY TECHNOLOGIES, INC., Hefei (CN)

(72) Inventors: Sukai Zhu, Hefei (CN); YenTeng Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 185 days.

(21) Appl. No.: 17/441,215

(22) PCT Filed: Jun. 30, 2021

(86) PCT No.: PCT/CN2021/103806
§ 371 (c)(1),
(2) Date: Sep. 20, 2021

(87) PCT Pub. No.: WO2022/077960
PCT Pub. Date: Apr. 21, 2022

(65) Prior Publication Data
US 2023/0098666 A1 Mar. 30, 2023

(30) Foreign Application Priority Data
Oct. 13, 2020 (CN) .......................... 202011087901.0

(51) Int. Cl.
*H01L 21/67* (2006.01)
*H01L 21/02* (2006.01)
(52) U.S. Cl.
CPC .. *H01L 21/67051* (2013.01); *H01L 21/02057* (2013.01)

(58) Field of Classification Search
CPC ..... B08B 15/02; B08B 3/022; B01D 46/0017; B01D 46/0041; B01D 2279/35;
(Continued)

(56) References Cited

U.S. PATENT DOCUMENTS

2018/0076057 A1* 3/2018 Ueki ................. H01L 21/67051
2018/0337067 A1* 11/2018 Kosai .................. H01L 21/6708

FOREIGN PATENT DOCUMENTS

CN 104377153 A 2/2015
CN 102319686 B 4/2015
(Continued)

OTHER PUBLICATIONS

CN110164795A (Year: 2019).*
International Search Report cited in PCT/CN2021/103806 dated Sep. 26, 2021, 9 pages.

*Primary Examiner* — Alexander Markoff
(74) *Attorney, Agent, or Firm* — Cooper Legal Group, LLC (57) ABSTRACT

The present application provides a wafer cleaning equipment and a wafer cleaning method. During wafer cleaning operation, the landing position of a cleaning agent sprayed by a nozzle onto the surface of a wafer can be detected, and when the landing position produces a deviation, the measures of controlling a nozzle adjusting mechanism to adjust the position and/or spray angle of the nozzle, controlling a flow rate adjusting unit to adjust the flow rate of the cleaning agent sprayed by the nozzle, etc. are taken, so that the landing position of the cleaning agent sprayed by the nozzle onto the surface of the wafer is within a preset target region.

14 Claims, 8 Drawing Sheets

(58) Field of Classification Search
CPC ......... H01L 21/67017; H01L 21/67051; H01L 21/67178; H01L 21/67253; H01L 21/6719; H01L 21/304; H01L 21/02057; H01L 21/67259
See application file for complete search history.

(56) References Cited

FOREIGN PATENT DOCUMENTS

| | | | | |
|---|---|---|---|---|
| CN | 108172533 A | 6/2018 | | |
| CN | 208806225 U | 4/2019 | | |
| CN | 110164795 A | 8/2019 | | |
| CN | 210523204 U | 5/2020 | | |
| CN | 210837677 U | 6/2020 | | |
| JP | 2015041672 A | 3/2015 | | |
| KR | 20080072230 A | 8/2008 | | |
| KR | 10-2010-0045802 | * | 10/2008 | |
| WO | WO-2017090505 A1 | * | 6/2017 | ............. B08B 3/024 |
| WO | WO-2020241033 A1 | * | 12/2020 | |

* cited by examiner

WAFER CLEANING EQUIPMENT AND CLEANING METHOD

CROSS-REFERENCE TO RELATED APPLICATIONS

The present application claims the priority to Chinese Patent Application 202011087901.0, titled "WAFER CLEANING EQUIPMENT AND CLEANING METHOD", filed to the CNIPA on Oct. 13, 2020, which is incorporated herein by reference in its entirety.

TECHNICAL FIELD

The present application relates to, but is not limited to, a wafer cleaning equipment and cleaning method.

BACKGROUND

In a semiconductor process, the cleanliness of a wafer surface is one of the important factors affecting the reliability of a semiconductor device. In common semiconductor processes, such as deposition, plasma etching, spin-on photoresist, photolithography, and electroplating, contaminants may be introduced to the wafer surface, resulting in a decrease in the cleanliness of the wafer surface. As a result, the yield of manufactured semiconductor devices is low.

Currently, after one or more semiconductor processes (such as CMP (Chemical Mechanical Polishing), PVD (Physical Vapor Deposition), and CVD (Chemical Vapor Deposition)) are performed, the wafer is usually cleaned with cleaning equipment to remove contaminants that may be formed on the surface of the wafer. The cleaning equipment uses a cleaning agent to clean the wafer. The landing position of the cleaning agent on the wafer is very important. If the landing position is not within a target region, the surface of the wafer cannot be completely covered by a water film and cannot be cleaned thoroughly, so that the cleaning effect is poor and the yield will be affected. The incomplete coverage of the water film will also cause temporary drying of some regions on the surface of the wafer. In addition, when the landing position is too close, the impact on the wafer will increase, which may destroy the completeness of a stack structure of the wafer, resulting in surface defects and a decline in product yield.

SUMMARY

The following is the summary of subject matters detailed in the present application. The summary is not intended to limit the protection scope of the claims.

The present application provides a wafer cleaning equipment and cleaning method.

The first aspect of the present application provides a wafer cleaning equipment, including:
- a wafer carrying structure, configured to carry a wafer, a center of the wafer is consistent with a center of the wafer carrying structure;
- a cleaning device, including a nozzle, the nozzle is disposed above the wafer carrying structure and is configured to spray a cleaning agent onto a surface of the wafer carried by the wafer carrying structure;
- a nozzle adjusting device, including a nozzle adjusting mechanism, the nozzle adjusting mechanism is connected to the nozzle and is configured to adjust at least one of a position and a spray angle of the nozzle;
- a flow rate adjusting device, including a flow rate adjusting unit, configured to adjust a flow rate of the cleaning agent sprayed by the nozzle; and
- a control unit, connected to the nozzle adjusting mechanism and the flow rate adjusting unit, configured to control at least one of the nozzle adjusting mechanism and the flow rate adjusting unit when it is determined that a landing position of the cleaning agent sprayed by the nozzle onto a surface of the wafer deviates from a preset target region, so that the landing position of the cleaning agent sprayed by the nozzle onto the surface of the wafer is within the preset target region.

The second aspect of the present application provides a wafer cleaning method, applied to the wafer cleaning equipment described in the first aspect, the wafer cleaning method including:
- placing a wafer on a wafer carrying structure, wherein a center of the wafer is consistent with a center of the wafer carrying structure;
- during wafer cleaning operation, detecting a landing position of a cleaning agent sprayed by a nozzle onto the surface of the wafer; and
- when it is determined that the detected landing position of the cleaning agent onto the surface of the wafer deviates from a preset target region, adjusting at least one of a position, and a spray angle of the nozzle, and a flow rate of the spayed cleaning agent, so that the landing position of the cleaning agent sprayed by the nozzle onto the surface of the wafer is within the preset target region.

Other aspects will be apparent upon reading and understanding the accompanying drawings and detailed descriptions.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present application. In these drawings, similar reference numerals are configured to indicate similar elements. The drawings in the following description are some embodiments of the present application, but not all embodiments. For those skilled in the art, other drawings can be obtained from these drawings without any creative efforts.

DETAILED DESCRIPTION

A clear and complete description will be made to the technical solutions in the disclosed embodiments below in conjunction with the drawings in the embodiments of the present application. Apparently, the embodiments described are only part of the embodiments of the present application, not all of them. All other embodiments obtained by those skilled in the art without any creative efforts based on the embodiments of the present application shall fall within the protection scope of the present application. It should be noted that the embodiments in the present application and the features in the embodiments may be combined with each other on a non-conflict basis.

Figure 1:
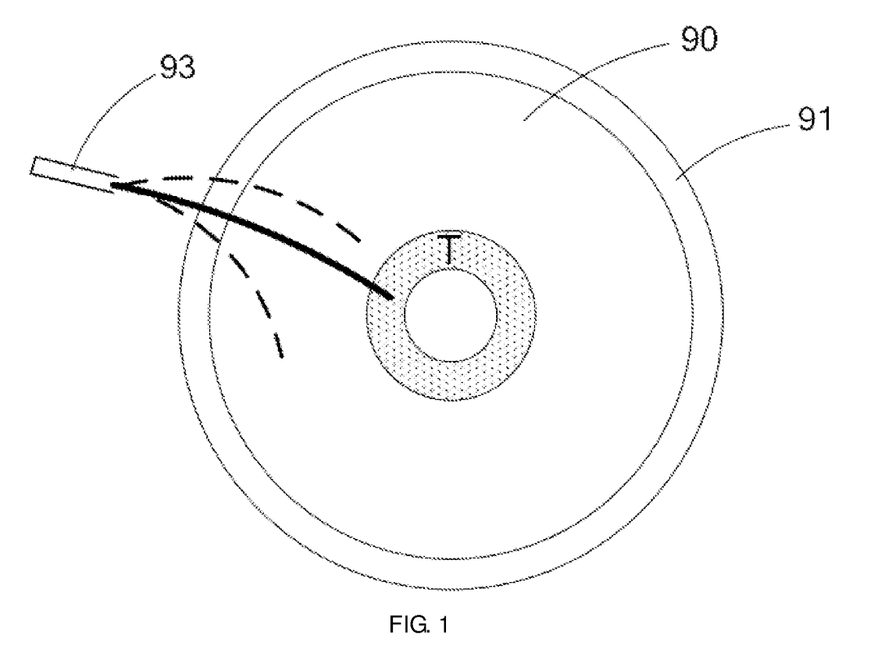
FIG. 1 shows a schematic structure diagram of a general cleaning equipment.

Currently, after a semiconductor process is performed, a wafer is cleaned with a cleaning equipment, for removing contaminants that may be formed on the surface of the wafer. Referring to FIG. 1, the cleaning equipment includes: a wafer carrier 91, the wafer carrier 91 is configured to carry a wafer 90, a driving device is disposed in the central region of the wafer carrier 91, and the wafer 90 is driven by the driving device to rotate; and a nozzle 93 disposed above the wafer carrier 91, the nozzle 93 spraying a cleaning agent into a target region T on the surface of the wafer when cleaning the wafer 90.

The inventor of the present application found, when the wafer is cleaned with the existing cleaning equipment, due to one or more factors such as increase in the service time of the cleaning equipment, change of the cleaning agent, and external interference (such as impact), the landing position of the cleaning agent sprayed by the nozzle onto the surface of the wafer is not within the target region, the surface of the wafer or the target region on the surface of the wafer cannot be completely covered by the cleaning agent, the surface of the wafer cannot be cleaned thoroughly, and contaminants may still remain on the surface of the wafer to affect product quality and yield.

In view of this, the inventor of the present application proposed a wafer cleaning equipment and a wafer cleaning method by transforming the existing wafer cleaning equipment. During wafer cleaning operation, the landing position of the cleaning agent sprayed by the nozzle onto the surface of the wafer can be detected, and when the landing position produces a deviation, the measures of controlling a nozzle adjusting mechanism to adjust the position and/or spray angle of the nozzle, controlling a flow rate adjusting unit to adjust the flow rate of the cleaning agent sprayed by the nozzle, etc. are taken, so that the landing position of the cleaning agent sprayed by the nozzle onto the surface of the wafer is within the preset target region, which avoids the problems of incomplete cleaning of the wafer, residual contaminants, etc.

The present application discloses a wafer cleaning equipment, the wafer cleaning equipment includes a wafer carrying structure, a nozzle, a nozzle adjusting device, a flow rate adjusting device, and a control unit.

The wafer carrying structure is configured to carry a wafer.

The nozzle is disposed above the wafer carrying structure, and is configured to spray a cleaning agent onto the surface of the wafer carried by the wafer carrying structure.

The nozzle adjusting device includes a nozzle adjusting mechanism, which is connected to the nozzle and is configured to adjust at least one of a position and a spray angle of the nozzle.

The flow rate adjusting device includes a flow rate adjusting unit, configured to adjust the flow rate of the cleaning agent sprayed by the nozzle.

The control unit is connected to the nozzle adjusting mechanism and the flow rate adjusting unit, and is configured to control at least one of the nozzle adjusting mechanism and the flow rate adjusting unit when it is determined that the landing position of the cleaning agent sprayed by the nozzle onto the surface of the wafer deviates from a preset target region, so that the landing position of the cleaning agent sprayed by the nozzle onto the surface of the wafer is within the preset target region.

With the wafer cleaning equipment of the present application, the landing position of the cleaning agent sprayed by the nozzle onto the surface of the wafer can be detected, and when it is determined that the landing position is not within the target region, at least one of the nozzle adjusting mechanism and the flow rate adjusting unit is controlled, so that the landing position of the cleaning agent sprayed by the nozzle onto the surface of the wafer is within the preset target region, which avoids the problems of incomplete cleaning of the wafer, residual contaminants, etc.

In the following embodiments, the wafer cleaning equipment will be described in detail with reference to the accompanying drawings.

Figure 2:
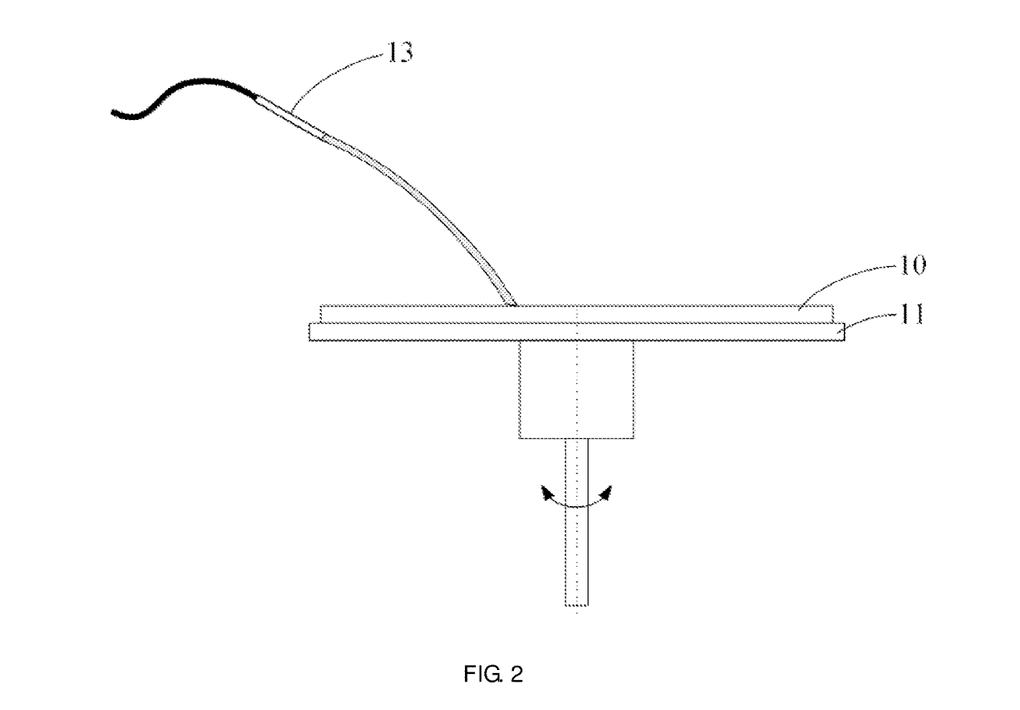
FIG. 2 shows a simple schematic diagram of a wafer cleaning equipment of the present application.

Referring to FIG. 2, a simple schematic diagram of the wafer cleaning equipment of the present application is shown. As shown in FIG. 2, the wafer cleaning equipment in this embodiment includes: a wafer carrying structure and a cleaning device.

The wafer carrying structure is configured to carry a wafer. As shown in FIG. 2, in this embodiment, the wafer carrying structure 11 adapted to the wafer 10 is circular, may be a circular platform or circular boss structure, and has an inner diameter greater than or equal to the diameter of the wafer. The wafer carrying structure 11 may further include support structures 111 arranged at intervals, or an integral surrounding support structure, and the number of support structures 111 is at least one. When there is a plurality of support structures 111, the support structures 111 may be uniformly arranged on the periphery of the wafer carrying structure 11 to support the edge of the wafer 10. The support structures 111 can be configured to maintain minimal contact with the wafer 10 when carrying the wafer 10. The support structure 111 is provided with a clamping structure for clamping the edge of the wafer 10 when carrying the wafer 10. When the wafer 10 is placed on the wafer carrying structure 11, the center of the wafer 10 is consistent with the center of the wafer carrying structure 11.

A rotation driving device may further be disposed in the center of the wafer carrying structure 11, and the rotation driving device drives the wafer carrying structure 11 and the wafer 10 carried thereon to rotate. In some embodiments, the rotation driving device has a rotating mechanism, and the rotating mechanism corresponds to the center of the wafer 10. The driving device drives the wafer 10 to rotate clockwise or counterclockwise around the center of the wafer. In an example, the rotating mechanism may include a rotating shaft and a rotating motor, the rotating shaft is coaxial with the center of the wafer 10, and the driving motor drives the wafer carrying structure 11 and the wafer 10 carried thereon to rotate through the rotating shaft.

The wafer cleaning equipment may further include an equipment body and a sealing cover, wherein the equipment body is of a hollow structure and has an accommodating space as a cleaning chamber, the wafer carrying structure 11 is disposed in the cleaning chamber, and the sealing cover is movably connected to the equipment body by, for example, a hinge, a rotating shaft, a hinge, a lock, etc.

The cleaning device is configured to clean the wafer carried by the wafer carrying structure. The cleaning device at least includes a nozzle, and the nozzle is configured to spray a cleaning agent onto the surface of the wafer carried by the wafer carrying structure. As shown in FIG. 2, in this embodiment, the nozzle 13 is disposed above the wafer 10 and is configured to spray a cleaning agent onto the surface of the wafer 10 carried by the wafer carrying structure 11.

The cleaning device may further include a cleaning pipe and a cleaning agent container (not shown in the figure). The nozzle 13 may be connected to the cleaning agent container through the cleaning pipe, that is, one end of the cleaning pipe is connected to the cleaning agent container, and the other end of the cleaning pipe is connected to the nozzle 13. The cleaning device may further include a switch for controlling the spraying of the cleaning agent, and the nozzle 13 can control the spraying of the cleaning agent onto the surface of the wafer 10 under the control of the switch. The cleaning agent may be deionized water (DI water), an acid chemical cleaning agent, an alkaline chemical cleaning agent, or an organic chemical cleaning agent (for example: alcohol, acetone, etc.). Of course, the cleaning pipe may still be changed according to the actual cleaning agent used. For example, in some embodiments, the cleaning device may include two or more cleaning agent containers. In some embodiments, the sizes of the cleaning agent containers are not limited, that is, the sizes of the cleaning agent containers may be uniform or different. In some embodiments, the types of cleaning agents contained in the cleaning agent containers are not limited, that is, the cleaning agent containers may contain the same cleaning agent or different cleaning agents, or some of them contain the same cleaning agent. In addition, the cleaning pipe in the cleaning device is adapted to the cleaning agent container. In some embodiments, there may be a plurality of cleaning pipes, each cleaning pipe has two ends, one end of which is connected to the corresponding cleaning agent container, and the other end is connected to the nozzle. In some embodiments, the cleaning pipe is designed on a one-to-one basis, that is, it has an input end and an output end, wherein the input end is connected to the corresponding cleaning agent container, and the output end is connected to the nozzle to avoid the problem of pipe pollution caused by introducing different cleaning agents into the same pipe. In addition, the cleaning device may further include an on-off valve or throttle valve, and the on-off valve or throttle valve may be configured on the corresponding cleaning pipe.

As the cleaning device is used, that is, the cleaning device can spray the cleaning agent through the nozzle 13 onto the surface of the wafer carried by the wafer carrying structure 11, the landing position of the cleaning agent sprayed by the nozzle 13 onto the surface of the wafer should be concerned during wafer cleaning operation. The wafer cleaning equipment disclosed in the present application is to detect the landing position of the cleaning agent sprayed by the nozzle 13 onto the surface of the wafer, and when it is determined that the landing position of the cleaning agent onto the surface of the wafer has a deviation and is not within a predetermined target region, the nozzle is correspondingly adjusted to ensure that the landing position of the cleaning agent onto the surface of the wafer is within the predetermined target region.

Therefore, the wafer cleaning equipment of the present application further includes: a nozzle adjusting device, a flow rate adjusting device, and a control unit.

Figure 3:
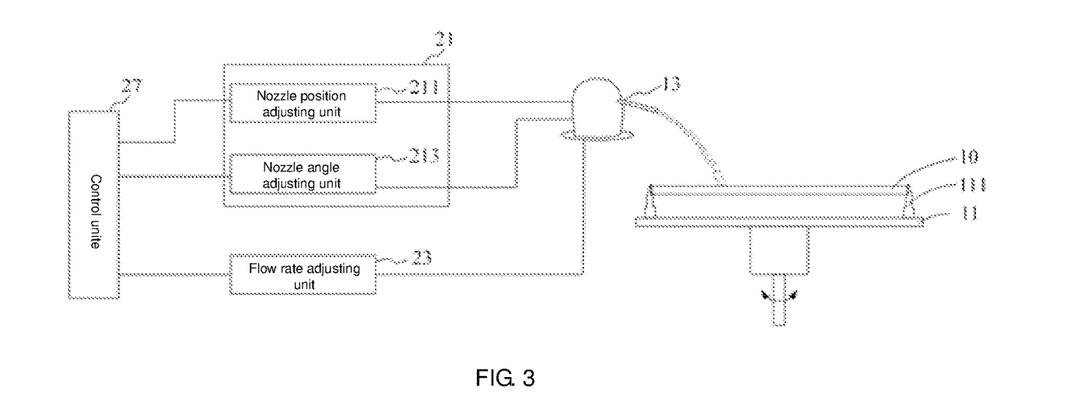
FIG. 3 shows a logic block diagram of the wafer cleaning equipment of the present application in an embodiment.

Referring to FIG. 3, a logic block diagram of the wafer cleaning equipment of the present application in an embodiment is shown. Detailed description will be given below in conjunction with FIGS. 2 and 3.

The nozzle adjusting device includes a nozzle adjusting mechanism, and the nozzle adjusting mechanism is connected to the nozzle and is configured to adjust at least one of a position and a spray angle of the nozzle. As shown in FIG. 3, in this embodiment, the nozzle adjusting device includes a nozzle adjusting mechanism 21, which is connected to the nozzle 13 and is configured to adjust the nozzle 13. The adjustment on the nozzle includes, but is not limited to, adjustment on the position of the nozzle, adjustment on the spray angle of the nozzle, and adjustment on the position and spray angle of the nozzle.

In some embodiments, the nozzle adjusting mechanism includes a nozzle position adjusting unit, and the nozzle position adjusting unit is configured to adjust the scale of the nozzle in at least one dimension of a three-dimensional space.

In practical applications, the nozzle position adjusting unit includes one or more of the following: a horizontal adjusting assembly and a height adjusting assembly, wherein the horizontal adjusting assembly is configured to adjust the position of the nozzle on the horizontal plane, and the height adjusting assembly is configured to adjust the position of the nozzle in the height direction. With regard to the horizontal plane, when the wafer 10 is placed on the wafer carrying structure 11, the wafer 10 is horizontal, that is, the surface of the wafer 10 is parallel to the horizontal plane.

In some examples, the horizontal adjusting assembly may include: a first direction adjusting assembly and a second direction adjusting assembly, wherein the first direction adjusting assembly is configured to adjust the position of the nozzle in a first direction, and the second direction adjusting assembly is configured to adjust the position of the nozzle in a second direction; the second direction is perpendicular to the first direction to constitute a horizontal plane.

In some examples, because the wafer is circular and is controlled to rotate, the horizontal adjusting assembly may include a radial adjusting assembly, configured to adjust the position of the nozzle in the radial direction of the wafer carrying structure.

In some embodiments, the nozzle adjusting mechanism includes a nozzle angle adjusting unit, and the nozzle angle adjusting unit is configured to adjust the spray angle of the nozzle.

In some applications, the nozzle angle adjusting unit includes one or more of the following: a horizontal plane angle adjusting assembly and a vertical plane angle adjusting assembly. The horizontal plane angle adjusting assembly is configured to adjust the spray angle of the nozzle in the horizontal plane, and the vertical plane angle adjusting assembly is configured to adjust the spray angle of the nozzle in the vertical plane, wherein the horizontal plane is perpendicular to the vertical plane.

In some applications, the nozzle angle adjusting unit includes a universal joint structure, and the nozzle is disposed on the universal joint structure.

The nozzle adjusting mechanism in the nozzle adjusting device can be configured to adjust at least one of the position and the spray angle of the nozzle.

The flow rate adjusting device includes a flow rate adjusting unit, and the flow rate adjusting unit is configured to adjust the flow rate of the cleaning agent sprayed by the nozzle. As shown in FIG. 3, in this embodiment, the flow rate adjusting device includes a flow rate adjusting unit 23, and the flow rate adjusting unit 23 is configured to adjust the flow rate of the cleaning agent sprayed by the nozzle, so as to change the landing position of the cleaning agent sprayed by the nozzle 13 onto the surface of the wafer.

In some embodiments, the flow rate adjusting unit may adjust the flow and the flow rate by adjusting the opening of the nozzle. In some embodiments, the flow rate adjusting unit may adjust the flow and the flow rate by adjusting the throttle valve on the cleaning pipe. In some embodiments, the flow rate adjusting unit may adjust the flow and the flow rate by controlling a hydraulic component in the cleaning device to change the pressure. Generally, if the flow and the flow rate are increased, the landing position of the cleaning agent sprayed by the nozzle onto the surface of the wafer may be further, and if the flow and the flow rate are decreased, the landing position of the cleaning agent sprayed by the nozzle onto the surface of the wafer may be closer.

The control unit is connected to the nozzle adjusting mechanism and the flow rate adjusting unit, and is configured to control the nozzle adjusting mechanism and the flow rate adjusting unit according to the landing position of the cleaning agent sprayed by the nozzle onto the surface of the wafer. As shown in FIG. 3, in this embodiment, the control unit 27 is connected to the nozzle adjusting mechanism 21 and the flow rate adjusting unit 23. The control unit 27 can perform at least the following: determining, according to the landing position information of the cleaning agent sprayed by the nozzle onto the surface of the wafer, whether the landing position of the cleaning agent onto the surface of the wafer deviates from a preset target region, and controlling at least one of the nozzle adjusting mechanism 21 and the flow rate adjusting unit 23 when it is determined that the landing position of the cleaning agent onto the surface of the wafer deviates from the preset target region, so that the landing position of the cleaning agent sprayed by the nozzle onto the surface of the wafer is within the preset target region.

In order to obtain the landing position information of the cleaning agent sprayed by the nozzle onto the surface of the wafer, the wafer cleaning equipment of the present application further includes a measuring wafer, and the size of the measuring wafer is the same as the size of an ordinary wafer. The surface of the measuring wafer is preset with a target landing region. According to the target landing region, the landing position of the cleaning agent sprayed by the nozzle onto the surface of the wafer can be obtained, whether the landing position is within the target landing region can be determined, and the nozzle position adjusting unit, the nozzle angle adjusting unit, the flow rate adjusting unit, etc. can be adjusted by the control unit until the landing position is within the target landing region.

In some embodiments, the detection of the landing position and the adjustment of the nozzle with the measuring wafer can be directly implemented by direct observation. For example, in some examples, the sealing cover of the wafer cleaning equipment is of a transparent structure or at least has an observation window. As such, a tester can directly observe the landing position of the cleaning agent sprayed by the nozzle onto the measuring wafer. When it is observed that the landing position deviates from the target landing region of the measuring wafer, the control unit is operated to adjust the nozzle position adjusting unit, the nozzle angle adjusting unit, the flow rate adjusting unit, etc., until the landing position is within the target landing region.

In conjunction with FIGS. 2 and 3, when at least one of the nozzle adjusting mechanism and the flow rate adjusting unit is controlled by the control unit to adjust the nozzle, the control unit continues to control, according to the change of the landing position information, at least one of the nozzle adjusting mechanism and the flow rate adjusting unit to adjust the nozzle, until the landing position of the cleaning agent sprayed by the nozzle onto the surface of the measuring wafer is within the predetermined target region.

In some embodiments, the wafer cleaning equipment of the present application further includes a landing detecting unit, configured to detecting the landing position of the cleaning agent sprayed by the nozzle onto the surface of the measuring wafer.

Figure 4:
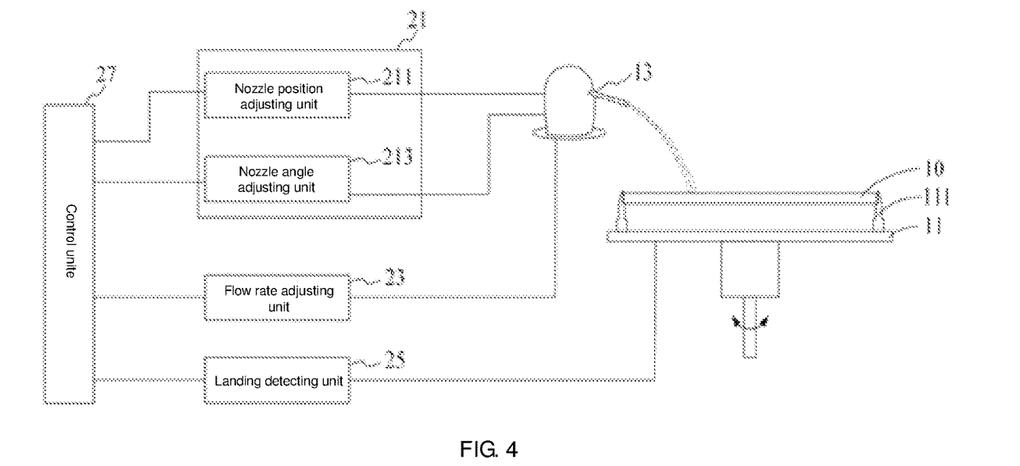
FIG. 4 shows a logic block diagram of the wafer cleaning equipment of the present application in another embodiment.

Referring to FIG. 4, a logic block diagram of the wafer cleaning equipment of the present application in another embodiment is shown. In another embodiment shown in FIG. 4, the landing detecting unit 25 is configured to detect the landing position of the cleaning agent sprayed by the nozzle 13 onto the surface of the measuring wafer, and send the detected landing position information to the control unit 27.

Still taking the measuring wafer as an example, in some examples, the landing detecting unit may include at least one pressure sensor or pressure sensor array arranged on the measuring wafer, and the landing position of the cleaning agent is determined using a pressure value obtained by the pressure sensor. The at least one pressure sensor or pressure sensor array may be arranged on the front side of the measuring wafer.

Taking the pressure sensor array as an example, in some applications, the sensor array is a sensor dot matrix. In the sensor dot matrix, a plurality of sensors are arranged horizontally and vertically at intervals. As such, when the cleaning agent sprayed by the nozzle arrives at the landing position on the surface of the measuring wafer, coordinate information of the landing position can be obtained through the sensor dot matrix.

In some applications, the sensor array is a sensor ring, or the sensor array is a linear sensor array in the radial direction of the measuring wafer. During the wafer cleaning process, when the cleaning agent sprayed by the nozzle arrives at the landing position on the surface of the measuring wafer, the coordinate information of the landing position can be obtained through the sensor ring or the linear sensor array, the coordinate information at least including the distance between the landing position and the center of the measuring wafer.

In some examples, the landing detecting unit may include an image detector or infrared detector, and the spray trajectory of the cleaning agent sprayed by the nozzle and the landing position onto the measuring wafer are obtained by the image detector or infrared detector.

The control unit 27 determines, according to the landing position information of the cleaning agent sprayed by the nozzle onto the surface of the wafer, whether the landing position of the cleaning agent onto the surface of the wafer deviates from a preset target region, and controls at least one of the nozzle adjusting mechanism 21 and the flow rate adjusting unit 23 when it is determined that the landing position of the cleaning agent onto the surface of the wafer deviates from the preset target region, so that the landing position of the cleaning agent sprayed by the nozzle onto the surface of the wafer is within the preset target region.

Controlling the nozzle adjusting mechanism includes: adjusting at least one of the position and the spray angle of the nozzle, specifically: controlling the nozzle position adjusting unit 211 in the nozzle adjusting mechanism 21 to adjust the scale of the nozzle 13 in at least one dimension of a three-dimensional space; or, controlling the nozzle angle adjusting unit 213 in the nozzle adjusting mechanism 21 to adjust the spray angle of the nozzle 13; or, controlling the nozzle position adjusting unit 211 in the nozzle adjusting mechanism 21 to adjust the scale of the nozzle 13 in at least one dimension of a three-dimensional space, and controlling the nozzle angle adjusting unit 213 in the nozzle adjusting mechanism 21 to adjust the spray angle of the nozzle 13.

Still taking the measuring wafer as an example, in some examples, when it is detected that the landing position of the cleaning agent onto the surface of the measuring wafer does not reach a predetermined target region (the distance between the landing position and the center of the measuring wafer is greater than that between the predetermined target region and the center of the measuring wafer), controlling the nozzle position adjusting unit in the nozzle adjusting mechanism to adjust the scale of the nozzle in at least one dimension of a three-dimensional space includes, but is not limited to, one or more of the following: adjusting the position of the nozzle on the horizontal plane, and moving the nozzle toward the measuring wafer to approach the measuring wafer; adjusting the position of the nozzle in the height direction to raise the nozzle to a certain height. Controlling the nozzle angle adjusting unit in the nozzle adjusting mechanism to adjust the spray angle of the nozzle includes, but is not limited to, one or more of the following: adjusting the angle of the nozzle such that the spray direction of the nozzle is more biased toward the center of the measuring wafer; adjusting the angle of the nozzle such that the spray direction of the nozzle is more horizontal.

In some examples, when it is detected that the landing position of the cleaning agent onto the surface of the measuring wafer exceeds the predetermined target region (the distance between the landing position and the center of the measuring wafer is less than that between the predetermined target region and the center of the measuring wafer), controlling the nozzle position adjusting unit in the nozzle adjusting mechanism to adjust the scale of the nozzle in at least one dimension of a three-dimensional space includes, but is not limited to, one or more of the following: adjusting the position of the nozzle on the horizontal plane, and moving the nozzle away from the measuring wafer to leave the measuring wafer; adjusting the position of the nozzle in the height direction to lower the nozzle to a certain height. Controlling the nozzle angle adjusting unit in the nozzle adjusting mechanism to adjust the spray angle of the nozzle includes, but is not limited to, one or more of the following: adjusting the angle of the nozzle to deviate the spray direction of the nozzle further from the center of the measuring wafer; adjusting the angle of the nozzle to deviate the spray direction of the nozzle further from the horizontal, for example, adjusting the spray direction of the nozzle to an elevation or depression angle with a certain angle to the horizontal.

In addition, controlling the flow rate adjusting unit includes adjusting the flow rate of the cleaning agent sprayed by the nozzle, which is implemented by ways including, but not limited to: adjusting the pressure of the cleaning pipe, adjusting the opening of the flow valve on the cleaning pipe, adjusting the opening of the nozzle, etc.

In some examples, when it is detected that the landing position of the cleaning agent onto the surface of the measuring wafer does not reach the predetermined target region (the distance between the landing position and the center of the measuring wafer is greater than that between the predetermined target region and the center of the measuring wafer), the flow rate adjusting unit is controlled to increase the flow rate of the cleaning agent sprayed by the nozzle. In some examples, when it is detected that the landing position of the cleaning agent onto the surface of the measuring wafer exceeds the predetermined target region (the distance between the landing position and the center of the measuring wafer is less than that between the predetermined target region and the center of the measuring wafer), the flow rate adjusting unit is controlled to decrease the flow rate of the cleaning agent sprayed by the nozzle.

As such, in conjunction with FIGS. 2 and 4, when at least one of the nozzle adjusting mechanism and the flow rate adjusting unit is controlled by the control unit to adjust the nozzle, the landing detecting unit detects the landing position of the cleaning agent sprayed by the nozzle onto the surface of the measuring wafer and sends the obtained landing position information to the control unit, such that the control unit continues to control, according to the change of the landing position information, at least one of the nozzle adjusting mechanism and the flow rate adjusting unit to adjust the nozzle, until the landing position of the cleaning agent sprayed by the nozzle onto the surface of the measuring wafer is within the predetermined target region.

Figure 5:
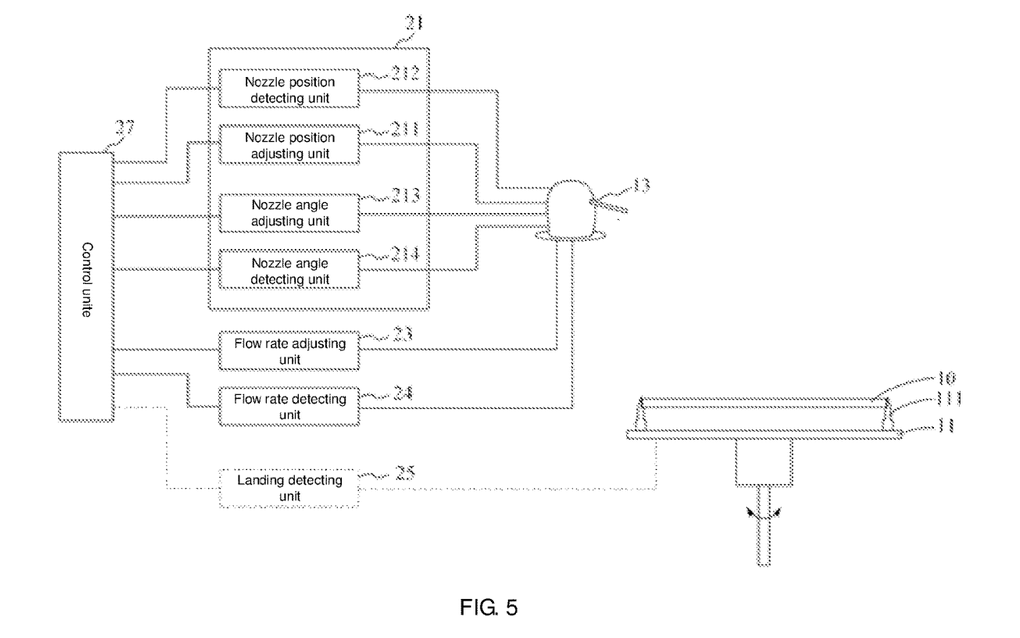
FIG. 5 shows a logic block diagram of the wafer cleaning equipment of the present application in still another embodiment.

In addition, the wafer cleaning equipment of the present application may still have other changes. Referring to FIG. 5, a logic block diagram of the wafer cleaning equipment of the present application in still another embodiment is shown. In still another embodiment shown in FIG. 5, the wafer cleaning equipment of the present application includes the aforementioned wafer carrying structure, cleaning device, nozzle adjusting device, flow rate adjusting device and control unit (may further include a landing detecting unit), and further includes at least one or more of the following: a nozzle position detecting unit, a nozzle angle detecting unit, and a flow rate detecting unit.

The nozzle position detecting unit is configured to detect position information of the nozzle. As shown in FIG. 5, the nozzle position detecting unit 212 corresponds to the nozzle position adjusting unit 211, and the nozzle position detecting unit 212 is connected to the control unit 27 and is configured to detect the position information of the nozzle 13 and send the detected position information to the control unit 27.

The nozzle angle detecting unit is configured to detect spray angle information of the nozzle. As shown in FIG. 5, the nozzle angle detecting unit 214 corresponds to the nozzle angle adjusting unit 213, and the nozzle angle detecting unit 214 is connected to the control unit 27 and is configured to detect the angle information of the nozzle 13 and send the detected angle information to the control unit 27.

The flow rate detecting unit is configured to detect flow rate information of the nozzle. As shown in FIG. 5, the flow rate detecting unit 24 corresponds to the flow rate adjusting unit 23, and the flow rate detecting unit 24 is connected to the control unit 27 and is configured to detect the flow rate information of the nozzle 13 and send the detected flow rate information to the control unit 27.

The control unit is configured to control the nozzle adjusting mechanism and the flow rate adjusting unit according to the landing position of the cleaning agent sprayed by the nozzle onto the surface of the measuring wafer. As shown in FIG. 5, the control unit 27 is connected to the landing detecting unit 25, the nozzle position detecting unit 212, the nozzle position adjusting unit 211, the nozzle angle detecting unit 214, the nozzle angle adjusting unit 213, the flow rate detecting unit 24, and the flow rate adjusting unit 23, and the control unit 27 can perform at least the following: receiving the landing position information, detected by the landing detecting unit 25, of the cleaning agent onto the surface of the measuring wafer, determining, according to the received landing position information, whether the landing position of the cleaning agent onto the surface of the measuring wafer deviates from a preset target region, and controlling, when it is determined that the landing position of the cleaning agent onto the surface of the measuring wafer deviates from the preset target region, at least one of the nozzle adjusting mechanism 21 (including the nozzle position adjusting unit 211 and the nozzle angle adjusting unit 213) and the flow rate adjusting unit 23 according to the position information of the nozzle 13 detected by the nozzle position detecting unit 212, the spray angle information of the nozzle 13 detected by the nozzle angle detecting unit 214, and the flow rate information of the nozzle 13 detected by the flow rate detecting unit 24, so that the landing position of the cleaning agent sprayed by the nozzle onto the surface of the measuring wafer is within the preset target region.

Controlling the nozzle adjusting mechanism includes: adjusting at least one of the position and the spray angle of the nozzle, specifically: controlling the nozzle position adjusting unit 211 in the nozzle adjusting mechanism 21 to adjust the scale of the nozzle 13 in at least one dimension of a three-dimensional space; or, controlling the nozzle angle adjusting unit 213 in the nozzle adjusting mechanism 21 to adjust the spray angle of the nozzle 13; or, controlling the nozzle position adjusting unit 211 in the nozzle adjusting mechanism 21 to adjust the scale of the nozzle 13 in at least one dimension of a three-dimensional space, and controlling the nozzle angle adjusting unit 213 in the nozzle adjusting mechanism 21 to adjust the spray angle of the nozzle 13.

In some embodiments, the control unit 27 and the nozzle position detecting unit 212 constitute a feedback adjusting mechanism, and the control unit 27 controls the nozzle adjusting mechanism and the flow rate adjusting unit based on the received landing position information of the cleaning agent onto the surface of the measuring wafer that is sent by the nozzle position detecting unit 212, and obtains the landing position information of the cleaning agent onto the surface of the measuring wafer that is fed back by the nozzle position detecting unit 212 in real time during the control, stops operation until the landing position information indicates that the landing position of the cleaning agent onto the surface of the measuring wafer is within the predetermined target landing region of the measuring wafer.

In some embodiments, the control unit 27 may be configured with at least one comparison table, the comparison table storing relevant information about the position of the nozzle, the angle of the nozzle, and the mapping relationship between the flow rate of the cleaning agent sprayed by the nozzle and the landing position of the sprayed cleaning agent onto the surface of the wafer. As such, when determining that the landing position of the cleaning agent sprayed by the nozzle 13 onto the surface of the wafer is not within the target region, the control unit 27 controls at least one of the nozzle adjusting mechanism 21 (including the nozzle position adjusting unit 211 and the nozzle angle adjusting unit 213) and the flow rate adjusting unit 23 with reference to the corresponding position information of the nozzle, angle information of the nozzle and flow rate information of the cleaning agent sprayed by the nozzle (the position information of the nozzle, angle information of the nozzle and flow rate information of the cleaning agent sprayed by the nozzle may be discrete values, continuous values, or numerical ranges) in the comparison table when the landing position is within the target region, and the received detected position information of the nozzle, angle information of the nozzle and flow rate information of the cleaning agent sprayed by the nozzle, so that the landing position of the cleaning agent sprayed by the nozzle onto the surface of the wafer is within the preset target region.

According to the wafer cleaning equipment disclosed by the present application, during wafer cleaning operation, the landing detecting unit can detect the landing position of the cleaning agent sprayed by the nozzle onto the surface of the measuring wafer, and when the landing position produces a deviation, the control unit takes the measures of controlling the nozzle adjusting mechanism to adjust the position and/or spray angle of the nozzle, controlling the flow rate adjusting unit to adjust the flow rate of the cleaning agent sprayed by the nozzle, etc., so that the landing position of the cleaning agent sprayed by the nozzle onto the surface of the wafer is within the preset target region, which improves the wafer cleaning effect and improves product performance and product yield.

Figure 6:
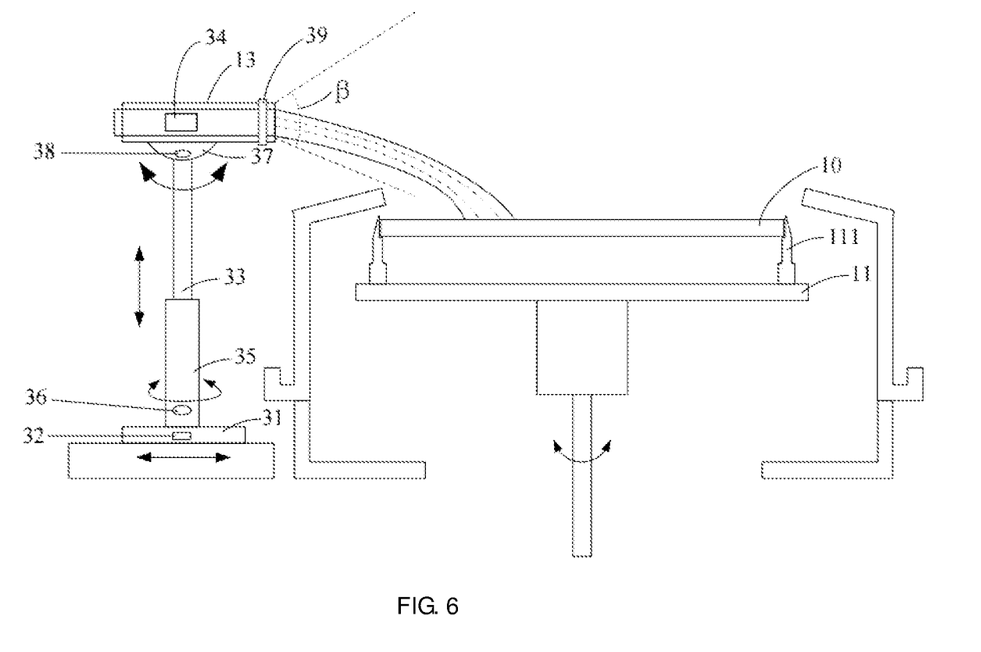
FIG. 6 shows a side view of the wafer cleaning equipment of the present application in an application example.
Figure 7:
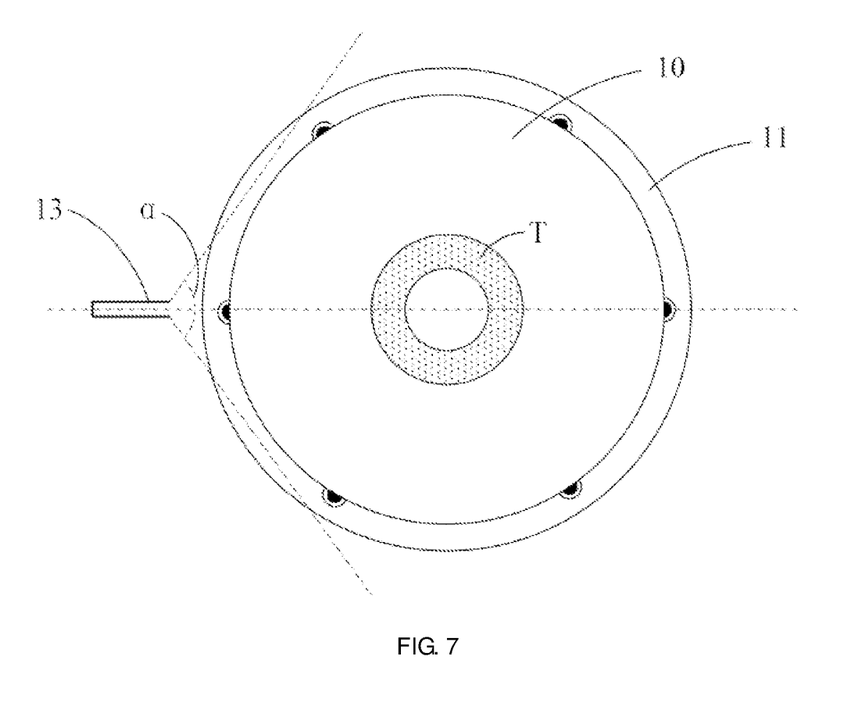
FIG. 7 shows a top view of the wafer cleaning equipment of the present application in an application example.

Referring to FIGS. 6 and 7, schematic structure diagrams of the wafer cleaning equipment of the present application in an application example are shown. FIG. 6 is a side view of the wafer cleaning equipment in this application example, and FIG. 7 is a top view of the wafer cleaning equipment in this application example.

In some embodiments, as shown in the figures, the wafer cleaning equipment includes a wafer carrying structure 11, the wafer carrying structure 11 carries a measuring wafer 10, and the center of the measuring wafer 10 is consistent with the center of the wafer carrying structure 11. The wafer cleaning equipment further includes a cleaning device, the cleaning device has a nozzle 13, and the nozzle 13 is disposed above the wafer 10 and is configured to spray a cleaning agent onto the surface of the measuring wafer 10 carried on the wafer carrying structure 11.

In this application example, the wafer cleaning equipment is further provided with a nozzle position adjusting unit and a nozzle angle adjusting unit.

The nozzle adjusting unit further includes a radial adjusting assembly 31 and a height adjusting assembly 33, wherein the radial adjusting assembly 31 is configured to adjust the position of the nozzle 13 in the radial direction of the wafer 10, and the height adjusting assembly 33 is configured to adjust the position of the nozzle 13 in the height direction.

Correspondingly, the wafer cleaning equipment in this application example is further provided with a radial position sensor 32 cooperating with the radial adjusting assembly 31 and a height sensor 34 cooperating with the height adjusting assembly 33, the radial position sensor 32 is configured to detect position information of the nozzle 13 in the radial direction, and the height sensor 34 is configured to detect position information of the nozzle 13 in height.

The nozzle angle adjusting unit further includes a horizontal plane angle adjusting assembly 35 and a vertical plane angle adjusting assembly 37. The horizontal plane angle adjusting assembly is configured to adjust the spray angle of the nozzle in the horizontal plane, and the horizontal plane angle adjusting assembly 35 adjusts the spray angle of the nozzle 13 in the horizontal plane from −90° to 90°, referring to angle α in FIG. 7. The vertical plane angle adjusting assembly 37 is configured to adjust the spray angle of the nozzle 13 in the vertical plane, and the vertical plane angle adjusting assembly 37 adjusts the spray angle of the nozzle 13 in the vertical plane from −90° to 90°, referring to angle β in FIG. 6.

Correspondingly, the wafer cleaning equipment in this application example is further provided with a horizontal plane angle sensor 36 cooperating with the horizontal plane angle adjusting assembly 35 and a vertical plane angle sensor 38 cooperating with the vertical plane angle adjusting assembly 37, the horizontal plane angle sensor 36 is configured to detect angle information of the nozzle 13 in the horizontal plane, and the vertical plane angle sensor 38 is configured to detect angle information of the nozzle 13 in the vertical plane.

In this application example, the wafer cleaning equipment further includes a flow rate adjusting unit (not shown in the figure) and a flow rate detector 39 cooperating with the flow rate adjusting unit, and the flow rate detector 39 is configured to detect flow rate information of the nozzle.

In this application example, the wafer cleaning equipment further includes a control unit (not shown in the figure), and the control unit is connected to the radial adjusting assembly 31, the height adjusting assembly 33, the horizontal plane angle adjusting assembly 35, the vertical plane angle adjusting assembly 37, the flow rate adjusting unit, the radial position sensor 32, the height sensor 34, the horizontal plane angle sensor 36, the vertical plane angle sensor 38, and the flow rate detector 39 described above.

During the wafer cleaning operation, the control unit can control at least one of the radial adjusting assembly 31, the height adjusting assembly 33, the horizontal plane angle adjusting assembly 35, the vertical plane angle adjusting assembly 37 and the flow rate adjusting unit when the obtained landing position of the cleaning agent sprayed by the nozzle 13 onto the surface of the measuring wafer 10 produces a deviation, so that the landing position of the cleaning agent sprayed by the nozzle 13 onto the surface of the measuring wafer 10 is within the preset target region T.

In some embodiments, the wafer cleaning equipment further includes a landing detecting unit, and the landing detecting unit is configured to detect the landing position of the cleaning agent sprayed by the nozzle 13 onto the surface of the measuring wafer 10. As such, during the wafer cleaning operation, the control unit can detect the landing position of the cleaning agent sprayed by the nozzle 13 onto the surface of the measuring wafer 10 by means of the landing detecting unit, and can control at least one of the radial adjusting assembly 31, the height adjusting assembly 33, the horizontal plane angle adjusting assembly 35, the vertical plane angle adjusting assembly 37 and the flow rate adjusting unit when the landing position produces a deviation, so that the landing position of the cleaning agent sprayed by the nozzle 13 onto the surface of the measuring wafer 10 is within the preset target region T.

Figure 8:
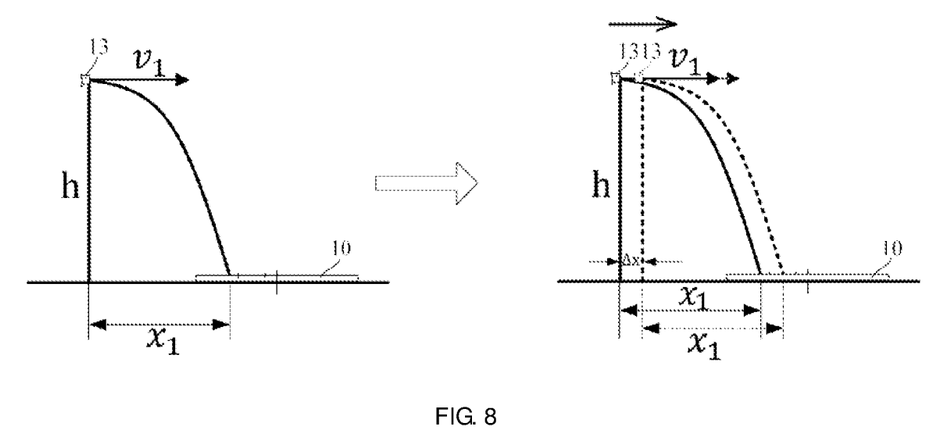
FIGS. 8 and 9 show schematic state diagrams of adjusting, by a radial adjusting assembly, the position of a nozzle on the horizontal plane in the wafer cleaning equipment of the present application.
Figure 9:
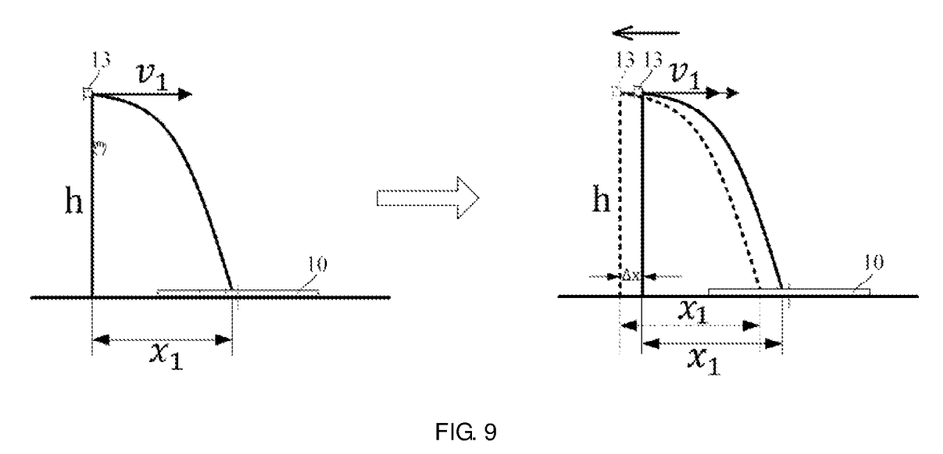

For example, in some examples, when the landing position produces a deviation, the position of the nozzle 13 on the horizontal plane, more specifically, in the radial direction of the wafer carrying structure, may be adjusted by controlling the radial adjusting assembly 31. For example, when the landing position of the cleaning agent sprayed by the nozzle 13 onto the surface of the measuring wafer 10 does not reach the target landing region, the radial adjusting assembly 31 is controlled to move the nozzle 13 by a corresponding distance toward the wafer carrying structure in the radial direction of the wafer carrying structure, referring to the schematic state diagram shown in FIG. 8 for details; when the landing position of the cleaning agent sprayed by the nozzle 13 onto the surface of the measuring wafer 10 exceeds the target landing region, the radial adjusting assembly 31 is controlled to move the nozzle 13 by a corresponding distance away from the wafer carrying structure in the radial direction of the wafer carrying structure, referring to the schematic state diagram shown in FIG. 9 for details.

Figure 10:
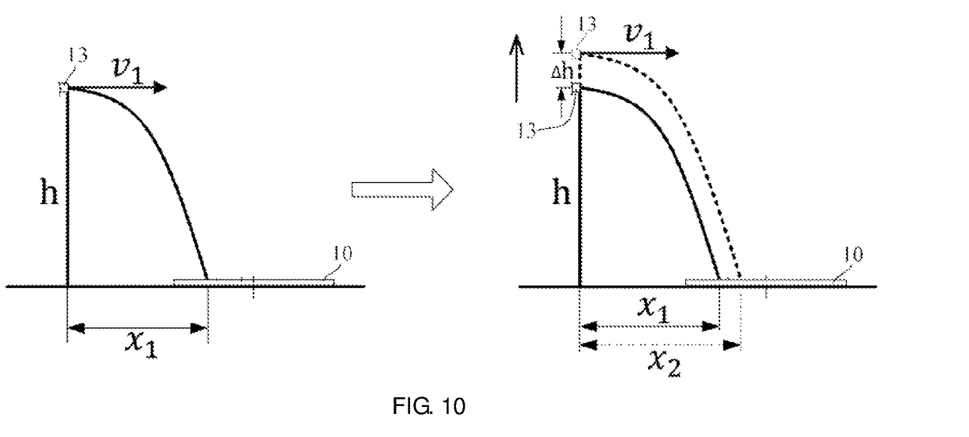
FIGS. 10 and 11 show schematic state diagrams of adjusting, by a height adjusting assembly, the position of the nozzle in the height direction in the wafer cleaning equipment of the present application.
Figure 11:
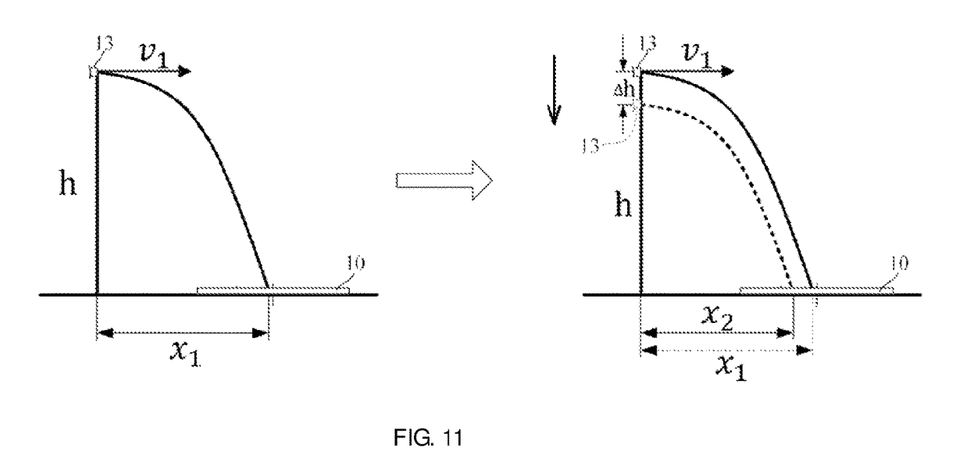

For example, in some examples, when the landing position produces a deviation, the position of the nozzle 13 in the height direction may be adjusted through the height adjusting assembly 33. For example, when the landing position of the cleaning agent sprayed by the nozzle 13 onto the surface of the measuring wafer 10 does not reach the target landing region, the height adjusting assembly 33 is controlled to raise the nozzle 13 by a corresponding height, referring to the schematic state diagram shown in FIG. 10 for details; when the landing position of the cleaning agent sprayed by the nozzle 13 onto the surface of the measuring wafer 10 exceeds the target landing region, the height adjusting assembly 33 is controlled to lower the nozzle 13 by a corresponding height, referring to the schematic state diagram shown in FIG. 11 for details.

Figure 12:
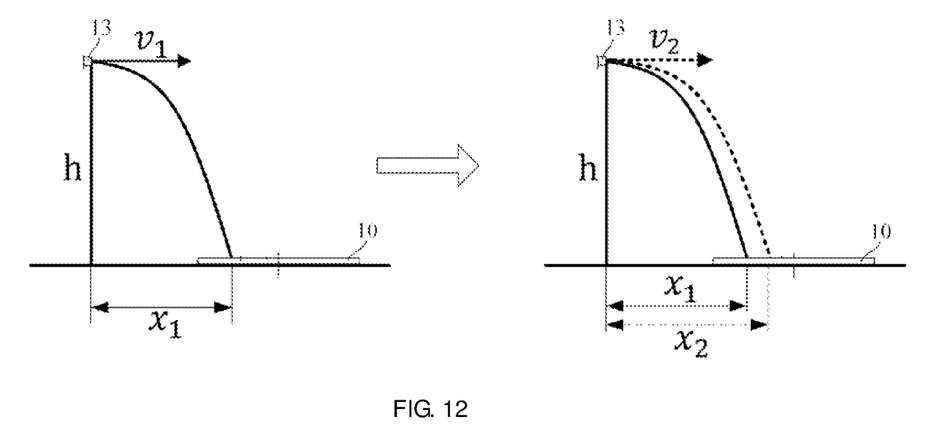
FIGS. 12 and 13 show schematic state diagrams of adjusting, by a flow rate adjusting unit, the flow rate of a cleaning agent sprayed by the nozzle in the wafer cleaning equipment of the present application.
Figure 13:
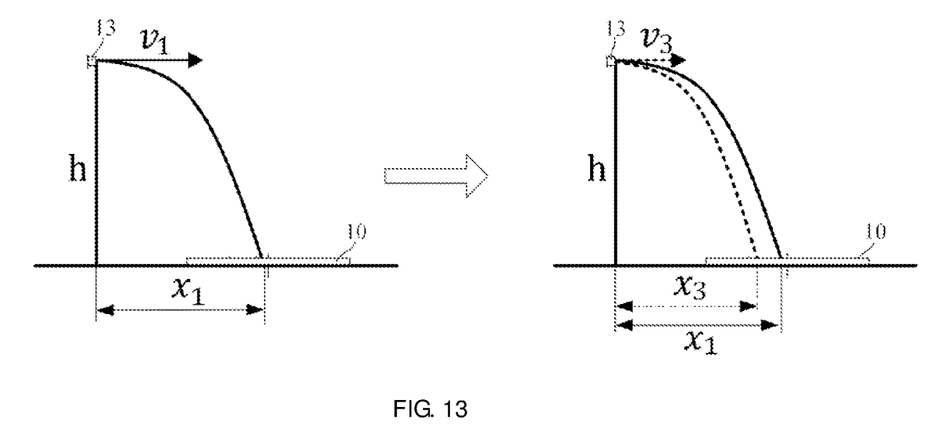

For example, in some examples, when the landing position produces a deviation, the flow rate of the cleaning agent sprayed by the nozzle 13 may be adjusted through the flow rate adjusting unit. For example, when the landing position of the cleaning agent sprayed by the nozzle 13 onto the surface of the measuring wafer 10 does not reach the target landing region, the flow rate adjusting unit is controlled to increase the flow rate of the cleaning agent sprayed by the nozzle 13, referring to the schematic state diagram shown in FIG. 12 for details, wherein the flow rate $v_2$ of the cleaning agent sprayed by the nozzle 13 is greater than the flow rate $v_1$ of the cleaning agent; when the landing position of the cleaning agent sprayed by the nozzle 13 onto the surface of the measuring wafer 10 exceeds the target landing region, the flow rate adjusting unit is controlled to decrease the flow rate of the cleaning agent sprayed by the nozzle 13, referring to the schematic state diagram shown in FIG. 13 for details, wherein the flow rate $v_3$ of the cleaning agent sprayed by the nozzle 13 is less than the flow rate $v_1$ of the cleaning agent.

In fact, the foregoing is only an exemplary description. The control unit is not limited to controlling one of the radial adjusting assembly 31, the height adjusting assembly 33, the horizontal plane angle adjusting assembly 35, the vertical plane angle adjusting assembly 37 and the flow rate adjusting unit. The adjusting assemblies can be used together. For example, the radial adjusting assembly 31 and the height adjusting assembly 33 are used together, the radial adjusting assembly 31 and the flow rate adjusting unit are used together, the height adjusting assembly 33 and the flow rate adjusting unit are used together, and the radial adjusting assembly 31, the height adjusting assembly 33, and the flow rate adjusting unit are used together; the horizontal plane angle adjusting assembly 35 is used alone, the vertical plane angle adjusting assembly 37 is used alone, and the horizontal plane angle adjusting assembly 35 and the vertical plane angle adjusting assembly 37 are used together; at least one of the radial adjusting assembly 31, the height adjusting assembly 33, and the flow rate adjusting unit is used together with at least one of the horizontal plane angle adjusting assembly 35 and the vertical plane angle adjusting assembly 37, etc. Based on the above, those skilled in the art can learn that the control unit in the wafer cleaning equipment of the present application can control one or more of the radial adjusting assembly 31, the height adjusting assembly 33, the horizontal plane angle adjusting assembly 35, the vertical plane angle adjusting assembly 37, and the flow rate adjusting unit, so that the landing position of the cleaning agent sprayed by the nozzle 13 onto the surface of the measuring wafer 10 is within the preset target region T.

The present application further discloses a wafer cleaning method, which is applied to the previous wafer cleaning equipment.

Figure 14:
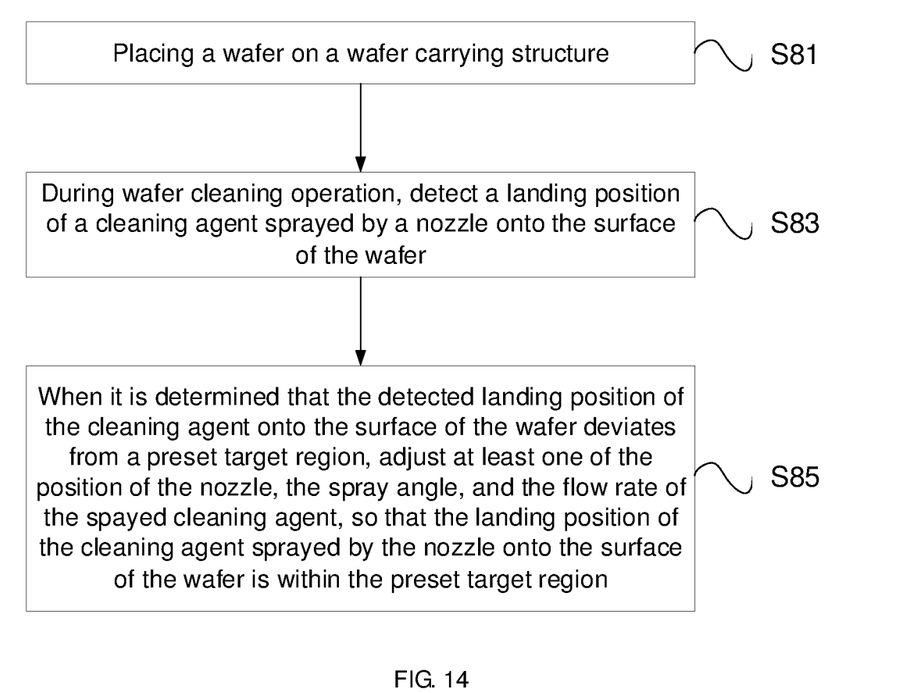
FIG. 14 shows a schematic flowchart of a wafer cleaning method of the present application in an embodiment.

Referring to FIG. 14, a schematic flowchart of a wafer cleaning method of the present application in an embodiment is shown.

As shown in FIG. 14, the wafer cleaning method of the present application includes the following steps:

Step S81, a wafer is placed on the wafer carrying structure.

Step S83, during wafer cleaning operation, a landing position of a cleaning agent sprayed by the nozzle onto the surface of the wafer is detected.

Step S85, when it is determined that the detected landing position of the cleaning agent onto the surface of the wafer deviates from a preset target region, at least one of the position, and the spray angle of the nozzle, and the flow rate of the spayed cleaning agent is adjusted, so that the landing position of the cleaning agent sprayed by the nozzle onto the surface of the wafer is within the preset target region.

In some embodiments, the wafer cleaning method of the present application can be completed by a measuring wafer. Specifically, the wafer cleaning equipment is tested and adjusted correspondingly by using a measuring wafer, so that the landing position of the cleaning agent sprayed by the nozzle in the wafer cleaning equipment onto the surface of the wafer is within the preset target region, and wafer products can be cleaned in batches later.

The following takes a measuring wafer as an example for description.

The measuring wafer is placed on the wafer carrying structure. When the measuring wafer is placed on the wafer carrying structure, the center of the wafer is consistent with the center of the wafer carrying structure.

The wafer carrying structure is driven to drive the measuring wafer to rotate, and the nozzle sprays a cleaning agent onto the surface of the measuring wafer.

When the cleaning agent is sprayed onto the surface of the measuring wafer, the landing position of the cleaning agent sprayed by the nozzle onto the surface of the wafer is detected. As before, the measuring wafer is preset with a target landing region. In some embodiments, when the measuring wafer is configured to detect the landing position and adjusting the nozzle, the landing position of the cleaning agent sprayed by the nozzle onto the surface of the measuring wafer may be directly obtained by observation. In some embodiments, the landing position of the cleaning agent sprayed by the nozzle onto the surface of the measuring wafer may be detected by the landing detecting unit configured.

When it is determined that the landing position of the cleaning agent onto the surface of the measuring wafer deviates from the target landing region, at least one of the position, and the spray angle of the nozzle, and the flow rate of the spayed cleaning agent is adjusted, so that the landing position of the cleaning agent sprayed by the nozzle onto the surface of the measuring wafer is within the preset target region. In some embodiments, whether the landing position of the cleaning agent sprayed by the nozzle onto the surface of the measuring wafer is within the target landing region may be determined by observation. In some embodiments, the landing position of the cleaning agent sprayed by the nozzle onto the surface of the measuring wafer may be detected by the landing detecting unit, and whether the landing position is within the target landing region may be determined according to the detected landing position.

As such, one or more of the position of the nozzle, the spray angle, and the flow rate of the sprayed cleaning agent is/are adjusted, until the landing position of the cleaning agent sprayed by the nozzle onto the surface of the measuring wafer is within the preset target region. Then the adjustment of the nozzle is completed, and wafer products can be cleaned in batches later.

According to the wafer cleaning method disclosed in the present application, during wafer cleaning operation, the landing position of the cleaning agent sprayed by the nozzle onto the surface of the wafer can be detected, and when the landing position produces a deviation, the measures of controlling the nozzle adjusting mechanism to adjust the position and/or spray angle of the nozzle, controlling the flow rate adjusting unit to adjust the flow rate of the cleaning agent sprayed by the nozzle, etc. are taken, so that the landing position of the cleaning agent sprayed by the nozzle onto the surface is within the preset target region, which improves the wafer cleaning effect and improves product performance and product yield.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present application, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present application and simplify the description only, rather than indicating or implying that the device or element referred to must have a particular orientation or be constructed and operated in a particular orientation, and will not to be interpreted as limiting the present application.

It can be understood that the terms "first", "second", etc. used in the present application may be used in the present application to describe various structures, but these structures are not limited by these terms. These terms are only configured to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present application are described below, such as the structure, material, dimension, treatment process and technology of devices, in order to understand the present application more clearly. However, as those skilled in the art can understand, the present application may not be implemented according to these specific details.

Finally, it should be noted that the above embodiments are merely intended to describe, but not to limit, the technical solutions of the present application. Although the present application is described in detail with reference to the above embodiments, those skilled in the art should understand that various modifications may be made to the technical solutions described in the foregoing embodiments or equivalent substitutions may be made to some or all technical features thereof, and these modifications or substitutions do not make the essences of the corresponding technical solutions depart from the scope of the technical solutions of the embodiments of the present application.

INDUSTRIAL APPLICABILITY

According to the wafer cleaning equipment and wafer cleaning method provided by the embodiments of the present application, during wafer cleaning operation, the landing position of the cleaning agent sprayed by the nozzle onto the surface of the wafer can be detected, and when the landing position produces a deviation, the measures of controlling the nozzle adjusting mechanism to adjust the position and/or spray angle of the nozzle, controlling the flow rate adjusting unit to adjust the flow rate of the cleaning agent sprayed by the nozzle, etc. are taken, so that the landing position of the cleaning agent sprayed by the nozzle onto the surface of the wafer is within the preset target region, which improves the wafer cleaning effect and improves product performance and product yield.

The invention claimed is:

1. A wafer cleaning equipment, the wafer cleaning equipment comprising:
   a wafer carrying structure, configured to carry a wafer, a center of the wafer is consistent with a center of the wafer carrying structure;
   a cleaning device, comprising a nozzle, the nozzle is disposed above the wafer carrying structure and is configured to spray a cleaning agent onto a surface of the wafer carried by the wafer carrying structure;
   a nozzle adjusting device, comprising a nozzle adjusting mechanism, the nozzle adjusting mechanism is connected to the nozzle and is configured to adjust at least one of a position or a spray angle of the nozzle, the nozzle adjusting mechanism comprises a nozzle position adjusting unit for adjusting the position of the nozzle in at least one dimension of a three-dimensional space, and the nozzle position adjusting unit comprises:
      a horizontal adjusting assembly for adjusting the position of the nozzle on a horizontal plane; and
      a height adjusting assembly for adjusting the position of the nozzle in a height direction;
   a flow rate adjusting device, comprising a flow rate adjusting unit, configured to adjust a flow rate of the cleaning agent sprayed by the nozzle;
   a measuring wafer, a size of the measuring wafer being the same as a size of the wafer, and a center of the measuring wafer is consistent with the center of the wafer carrying structure;
   a landing detecting unit, configured to detect a landing position of the cleaning agent sprayed by the nozzle onto a surface of the measuring wafer; and
   a control unit, connected to the landing detecting unit, the nozzle adjusting mechanism and the flow rate adjusting unit, configured to detect the landing position of the cleaning agent sprayed by the nozzle onto the surface of the measuring wafer by means of the landing detecting unit and control at least one of the nozzle adjusting mechanism or the flow rate adjusting unit when it is determined that the landing position of the cleaning agent sprayed by the nozzle onto the surface of the measuring wafer deviates from a preset target region, so that the landing position of the cleaning agent sprayed by the nozzle onto the surface of the measuring wafer is within the preset target region, wherein the preset target region is a circular region.

2. The wafer cleaning equipment according to claim 1, wherein the horizontal adjusting assembly comprises:
   a first direction adjusting assembly, configured to adjust the position of the nozzle in a first direction; and
   a second direction adjusting assembly, configured to adjust the position of the nozzle in a second direction; the second direction is perpendicular to the first direction to constitute the horizontal plane.

3. The wafer cleaning equipment according to claim 1, wherein the horizontal adjusting assembly comprises:
   a radial adjusting assembly, configured to adjust the position of the nozzle in a radial direction of the wafer carrying structure.

4. The wafer cleaning equipment according to claim 1, wherein the nozzle adjusting device further comprises a nozzle position detecting unit connected to the control unit and configured to detect position information of the nozzle.

5. The wafer cleaning equipment according to claim 1, wherein the nozzle adjusting mechanism comprises: a nozzle angle adjusting unit for adjusting the spray angle of the nozzle.

6. The wafer cleaning equipment according to claim 5, wherein the nozzle angle adjusting unit comprises one or more of the following:
   a horizontal plane angle adjusting assembly, configured to adjust the spray angle of the nozzle in the horizontal plane; and
   a vertical plane angle adjusting assembly, configured to adjust the spray angle of the nozzle in a vertical plane.

7. The wafer cleaning equipment according to claim 6, wherein the horizontal plane angle adjusting assembly adjusts the spray angle of the nozzle in the horizontal plane relative to a line passing through the center of the measuring wafer and the nozzle from −90° to 90°.

8. The wafer cleaning equipment according to claim 6, wherein the vertical plane angle adjusting assembly adjusts the spray angle of the nozzle in the vertical plane relative to the horizontal plane where the nozzle located from −90° to 90°.

9. The wafer cleaning equipment according to claim 5, wherein the nozzle angle adjusting unit comprises a universal joint structure, and the nozzle is disposed on the universal joint structure.

10. The wafer cleaning equipment according to claim 5, wherein the nozzle adjusting device further comprises a nozzle angle detecting unit connected to the control unit and configured to detect the spray angle of the nozzle.

11. The wafer cleaning equipment according to claim 1, wherein the flow rate adjusting device further comprises a flow rate detecting unit connected to the control unit and configured to detect a flow rate of the nozzle.

12. The wafer cleaning equipment according to claim 1, wherein the landing detecting unit comprises at least one pressure sensor or a pressure sensor array.

13. The wafer cleaning equipment according to claim 1, wherein the landing detecting unit comprises an image detector or an infrared detector.

14. A wafer cleaning method applied to the wafer cleaning equipment according to claim 1, the wafer cleaning method comprising:
- placing the measuring wafer on the wafer carrying structure;
- during wafer cleaning operation, detecting the landing position of the cleaning agent sprayed by the nozzle onto the surface of the measuring wafer; and
- when it is determined that the detected landing position of the cleaning agent onto the surface of the measuring wafer deviates from the preset target region, adjusting at least one of the position or the spray angle of the nozzle, and the flow rate of the spayed cleaning agent, so that the landing position of the cleaning agent sprayed by the nozzle onto the surface of the measuring wafer is within the preset target region.

\* \* \* \* \*